United States Patent [19]
Levy et al.

[11] Patent Number: 5,976,982
[45] Date of Patent: Nov. 2, 1999

[54] METHODS FOR PROTECTING DEVICE COMPONENTS FROM CHEMICAL MECHANICAL POLISH INDUCED DEFECTS

[75] Inventors: Max G. Levy, Essex Junction, Vt.; Wolfgang Bergner, Stormville, N.Y.; Bernhard Fiegl, Mechanicsville, Va.; George R. Goth, Poughkeepsie, N.Y.; Paul Parries, Wappingers Falls, N.Y.; Matthew J. Sendelbach, Wappingers Falls, N.Y.; Tinghao T. Wang, Round Rock, Tex.; William C. Wille, Red Hook; Juergen Wittmann, Fishkill, both of N.Y.

[73] Assignees: Siemens Aktiengesellschaft, Munich, Germany; International Business Machines Corporation, Armonk, N.Y.

[21] Appl. No.: 08/884,120

[22] Filed: Jun. 27, 1997

[51] Int. Cl.$^6$ .................................................. H01L 21/304
[52] U.S. Cl. ........................... 438/692; 438/706; 438/710
[58] Field of Search .................................. 438/689, 691, 438/692, 695, 706, 710

[56] References Cited

U.S. PATENT DOCUMENTS

| | | | |
|---|---|---|---|
| 4,741,799 | 5/1988 | Chen et al. | 156/643 |
| 5,182,234 | 1/1993 | Meyer et al. | 438/695 |
| 5,494,857 | 2/1996 | Cooperman et al. | 437/228 |
| 5,595,627 | 1/1997 | Inazawa et al. | 156/643.1 |
| 5,607,874 | 3/1997 | Wang et al. | 438/397 |
| 5,759,888 | 6/1998 | Wang et al. | 438/397 |

FOREIGN PATENT DOCUMENTS

| | | | |
|---|---|---|---|
| 0 341 898 A2 | 5/1989 | European Pat. Off. | 21/76 |
| 0 341 898 A3 | 5/1989 | European Pat. Off. | 21/76 |

OTHER PUBLICATIONS

European Patent Office—Patent Abstract of Japan—Publication No. 09129611 dated May 16, 1997.
Technical Disclosure Bulletin from IBM, vol, 32, No. 9A, dated Feb. 1990.

*Primary Examiner*—Benjamin Utech
*Assistant Examiner*—Kin-Chan Chen
*Attorney, Agent, or Firm*—Stanton C. Braden

[57] ABSTRACT

A method for preventing CMP-induced (chemical-mechanical polish) damage to a substrate disposed below a pad nitride layer of a mesa. The pad nitride layer is disposed below a conformally deposited dielectric layer. The dielectric layer is disposed below a conformally deposited polysilicon layer. The method includes planarizing the polysilicon layer down to at least a surface of the dielectric layer using the CMP to expose a first region of the dielectric layer. The method further includes etching partially through the first region of the dielectric layer using first etch parameters. The first etch parameters include an etchant source gas that is substantially selective to the pad nitride layer to prevent the pad nitride layer from being etched through even in the presence of a CMP defect. Additionally, there is also included removing the polysilicon layer after the etching partially through the first region of the dielectric layer.

19 Claims, 2 Drawing Sheets

METHODS FOR PROTECTING DEVICE COMPONENTS FROM CHEMICAL MECHANICAL POLISH INDUCED DEFECTS

BACKGROUND OF THE INVENTION

The present invention relates to the fabrication of semiconductor integrated circuits (IC's). More particularly, the present invention relates to techniques for protecting device components from chemical-mechanical polish (CMP) induced substrate damage.

In semiconductor IC fabrication, devices such as component transistors are formed on a substrate, which may typically be made of silicon. Uses for the substrate may include, for example, the fabrication of ICs or flat panel displays. Successive layers of various materials may be deposited onto a substrate and selectively removed to form layered mesa structures on a silicon wafer. In a previously-filed patent application entitled "Self-Aligned Polysilicon FET Devices Isolated with Maskless Shallow Trench Isolation and Gate Conductor Fill Technology and Method of Manufacture Thereof," (Attorney Docket No. HQ9-96-051), filed May 1, 1997 (Ser. No. 08/515,714) and incorporated herein by reference, a layered mesa structure is described for isolating devices in the formation of FET devices fabricated in accordance with very large scale integration (VLSI) techniques. In general, a layered mesa structure may include pad layers, e.g., pad nitride and pad oxide layers, deposited over a silicon mesa (which may be single crystal silicon in structure). To facilitate discussion, FIG. 1 illustrates a layer stack 110, which may be formed on a substrate 112. A pair of mesas 114 and 116 are formed on substrate 112 by masking and etching a shallow trench into the substrate to form the silicon mesas. The resulting mesas are then capped with one or more pad layers.

As shown in FIG. 1, mesa structure 114 includes pad layers, some of which are shown as a pad nitride layer 118 overlying a pad oxide layer 120. Pad oxide layer 120 may be, for example, about 25–300 angstroms thick. Pad nitride layer 118 may be, for example, about 500 to about 2,500 angstroms thick. Likewise, mesa structure 116 includes pad layers, some of which are shown as a pad nitride layer 122 overlying a pad oxide layer 124. A dielectric layer 126, which may be TEOS or silicon dioxide, is shown conformally deposited over substrate 112 and the pad layers of mesa structures 114 and 116. This dielectric layer 126 may be, for example, about 3,000 to about 9,000 angstroms thick. The dielectric material disposed between the mesa structures provides the shallow trench isolation (STI) region to isolate devices of the mesa structures.

Above dielectric layer 126, there is disposed a polysilicon layer 130, representing the layer from which a mask may be formed to facilitate the subsequent etching of dielectric layer 126. The polysilicon may be, for example, about 2,000 to about 8,000 angstroms thick. FIG. 2 shows the substrate of FIG. 1 after a chemical-mechanical polish (CMP) step has been employed to planarize polysilicon layer 130 and silicon dioxide layer 126. The CMP process typically terminates when the high areas of silicon dioxide layer 126 break through polysilicon layer 130, and/or the exposed silicon dioxide layer is planarized to a specific design thickness (i.e., it is not always required that the CMP step terminates exactly when high areas of silicon dioxide layer 126 break through polysilicon layer 130). After CMP, the high areas of the dielectric layer are exposed through the polysilicon layer to facilitate dielectric etching while other areas of the substrate are masked off by the remaining polysilicon.

During CMP, however, the exposed surface of silicon dioxide layer 126 may be damaged by various CMP process defects. These CMP process defects include, for example, scratching and over-polishing. Scratching may occur when an abrasive particle comes between a CMP rotating pad and the exposed oxide surface. The rotational force and pressure of the pad against the abrasive particle may gouge the exposed oxide surface. This scratch is illustrated as scratch 200 over mesa structure 116. As can be seen in FIG. 2, the presence of scratch 200 decreases the thickness of the dielectric material above pad nitride layer 122.

Over-polishing may also produce thin areas of the dielectric layer and may result from improper CMP process parameters, which may include improper process duration, pad pressure, pad abrasiveness, brushing speed, slurry chemistry and other factors. When one or more CMP process parameters are incorrect it may not be possible to precisely control the material removal and a thinner than desired dielectric layer may be present over the mesa structure. dielectric etch has removed portions of the unprotected areas of silicon dioxide layer 126 to form hollows. During the dielectric etch, the regions of polysilicon layer 130 that were not removed by CMP act as a hard mask which protects the underlying dielectric material. Typically, the dielectric etch is designed (e.g., timed) to leave a controlled amount of dielectric material above the pad layer, e.g., above the pad nitride layer. By way of example, the dielectric etch may represent a partial reactive ion etching (RIE) or wet etch of the exposed surface of the dielectric material and remove about 2,000 to about 9,800 angstroms of silicon dioxide. With reference to FIG. 3, the dielectric etch is designed to form a hollow 302 in dielectric layer 126 and to leave a thin (e.g., about 800 to 900 angstroms thick) dielectric layer 320 above pad nitride layer 118 of mesa structure 114. However, where silicon dioxide layer 126 is thinner than intended due to CMP process defects (e.g., due to scratch 200 as shown in FIG. 2), the thinner silicon dioxide layer above the mesa may be completely etched through instead of only partially etched. Further, the previously disclosed dielectric etch chemistry, which typically includes a mixture of $CHF_3$, $CF_4$, and/or argon, permits the pad layer(s) (e.g., pad nitride 122 and pad oxide 124) to be etched through during this dielectric etch step, thereby exposing some of the underlying substrate 112 material (typically single crystal silicon in structure). The inadvertent etching of the pad nitride layer and the pad oxide layer is depicted above mesa structure 116 of FIG. 3. Due to the fact that the dielectric etch chemistry is typically selective to silicon (so as to avoid attacking the polysilicon hard mask), the underlying silicon substrate 112 is typically not attacked during this dielectric etch step even if the pad layers are inadvertently etched through.

To facilitate further processing, the polysilicon hard mask may then be removed. Because the polysilicon etchant (typically comprising $SF_6$ and $NF_3$) or wet etch employed to remove the polysilicon hard mask typically does not readily attack the dielectric material, layers underlying thin dielectric layer 320 (e.g., pad nitride layer 118, pad oxide layer 120, and the substrate materials underlying these layers) are protected during this polysilicon removal step. However, the polysilicon etchant readily attacks any silicon substrate material (e.g., single crystal silicon) exposed by a combination of CMP process defects and the $CHF_3/CF_4/Ar$ dielectric etch or wet etch. With reference to FIG. 3, the substrate material at the region of mesa structure 116 would then be inadvertently etched away during the polysilicon removal step. The result is a CMP-induced substrate defect (which is shown as a void 402 in FIG. 4) in substrate 112 in the region of mesa structure 116.

This void may also be formed if the layer stack is over-polished during the CMP step such that a thinner-than intended dielectric layer is present above mesa structure 116 prior to the subsequent dielectric etch step. The result of over-polishing is depicted in FIG. 5, which shows a thinner layer of dielectric material overlying mesa structure 116 as compared to the layer of dielectric material overlying mesa structure 114. The presence of void 402 in the substrate may cause problems to devices subsequently formed. By way of example, void 402 may result shorting of the subsequently deposited gate conductors and/or gate oxide breakdown, which leads to gate-to-substrate, gate-to-ground shorts, etc.

In view of the foregoing, there are desired improved methods for protecting device components from CMP defect-induced etching damage during dielectric etching.

SUMMARY OF THE INVENTION

The invention relates, in one embodiment, to a method for preventing CMP-induced (chemical-mechanical polish) damage to a substrate disposed below a pad nitride layer of a mesa. The pad nitride layer is disposed below a conformally deposited dielectric layer. The dielectric layer is disposed below a conformally deposited polysilicon layer. The method includes planarizing the polysilicon layer down to at least a surface of the dielectric layer using the CMP to expose a first region of the dielectric layer.

The method further includes etching partially through the first region of the dielectric layer using first etch parameters. The first etch parameters include an etchant source gas that is substantially selective to the pad nitride layer to prevent the pad nitride layer from being etched through even in the presence of a CMP defect. Additionally, there is also included removing the polysilicon layer after the etching partially through the first region of the dielectric layer.

In another embodiment, the invention-relates to a method for manufacturing a shallow trench isolation (STI) field effect transistor (FET) device. The FET device is formed above a silicon mesa of a silicon substrate. The method includes depositing a layer of pad nitride above the silicon mesa. The method further includes conformally depositing a layer of TEOS above the pad nitride layer and an upper surface of the silicon substrate. There is also included conformally depositing a layer of polysilicon above the TEOS.

Furthermore, the method includes planarizing the polysilicon layer down to at least a surface of the TEOS layer using a chemical-mechanical polish process to expose a first region of the TEOS layer, the first region being disposed above the pad nitride layer.

Additionally, the method includes etching partially through the first region of the TEOS layer using first etch parameters. The first etch parameters are configured to leave a thin layer of the TEOS above the pad nitride layer. The first etchant parameters include an etchant source gas that is substantially selective to the pad nitride layer to prevent the pad nitride layer from being etched through even in the presence of a CMP defect. The method also includes removing the polysilicon layer after the etching partially through the first region of the dielectric layer.

These and other features of the present invention will be described in more detail below in the detailed description of the invention and in conjunction with the following figures.

BRIEF DESCRIPTION OF THE DRAWINGS

These and other advantages of the present invention will become apparent upon reading the following detailed descriptions and studying the various figures of the drawings in which like reference number refer to like structures and in which: To facilitate discussion.

DETAILED DESCRIPTION OF THE INVENTION

The present invention will now be described in detail with reference to a few embodiments as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention relates to fabrication of ICs on subtrate. Such ICs memories like random access memory (RAMs), dynamic RAMs (DRAMs), synchronous (DRAMs), static RAMs (SRAMs), and read only memories (ROMs). Other ICs such as logic devices including application specific ICs (ASICs) and programmable logic arrays (PLAs), are also applicable.

In accordance with one aspect of the present invention, the CMP-induced substrate defect during IC fabrication is addressed by advantageously employing a dielectric etch process that is not only selective to the polysilicon hard mask but is also selective to the pad layer, e.g., to the pad nitride, underneath. In other words, the inventive etchant process preferably can etch through the oxide of the dielectric layer with a high degree of uniformity and an advantageous etch rate without attacking the polysilicon hard mask and/or any exposed pad nitride. Advantageously, the inventive dielectric etch process does not etch through the pad nitride even if scratches and/or over-polishing and/or other CMP process defects are present.

Figure 1:
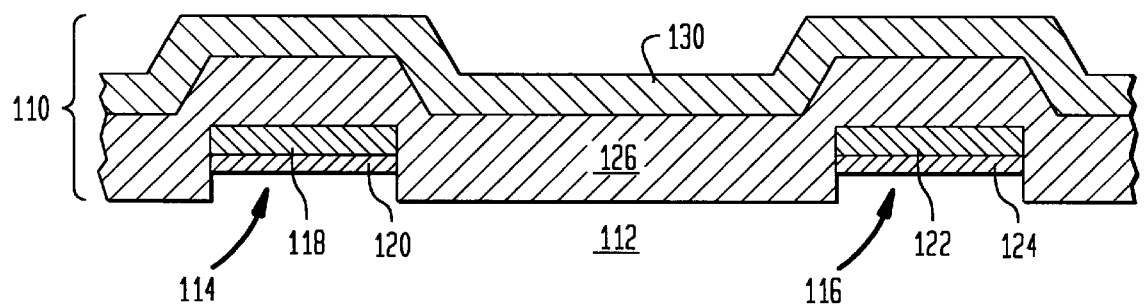
FIG. 1 illustrates a layer stack, including a pair of mesa structures.
Figure 2:
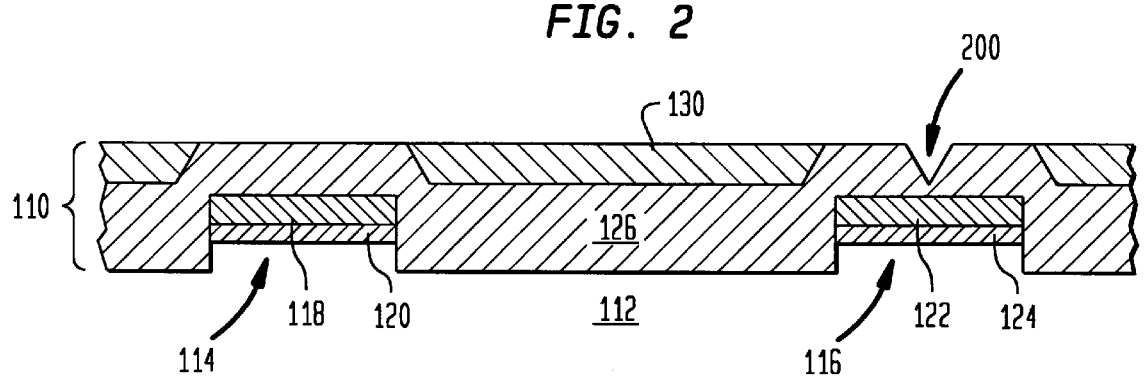
FIG. 2 shows the substrate of FIG. 1 after a chemical-mechanical polish (CMP) step has been employed to planarize the polysilicon layer and the silicon dioxide layer.
Figure 6:
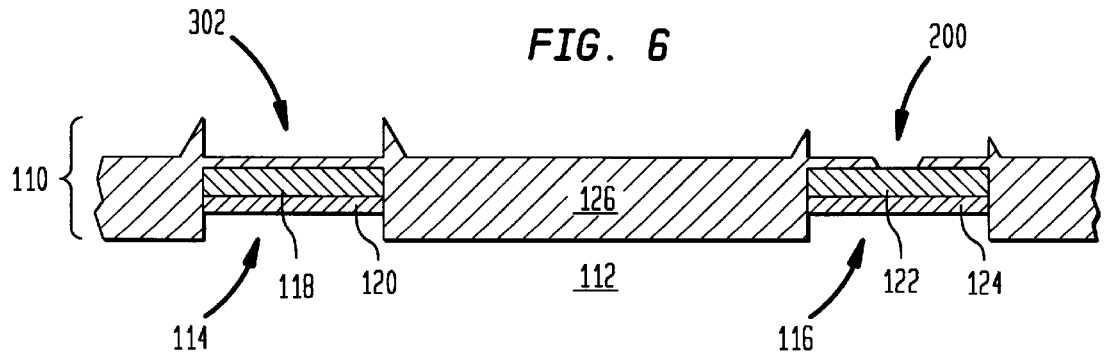
FIG. 6 illustrates layer stack of FIG. 2 after the oxide layer has been etched using the inventive dielectric etch process.

During the subsequent polysilicon strip step, the fact that the underlying silicon substrate is protected by the pad nitride means that no silicon substrate will be etched away (since the polysilicon etchant source gas is substantially selective to pad nitride and to oxide) to cause the aforementioned CMP-induced substrate defects. FIG. 6 illustrates layer stack 110 of FIG. 2 after the oxide layer 126 has been etched using the inventive dielectric etch process. As shown in FIG. 6, pad nitride layer 122 is not etched through even if scratch 200 reduces the thickness of the oxide layer above mesa structure 116 prior to the dielectric etch step. In FIG. 6, the polysilicon hard mask has been removed without causing any damage to the underlying substrate 112.

Figure 3:
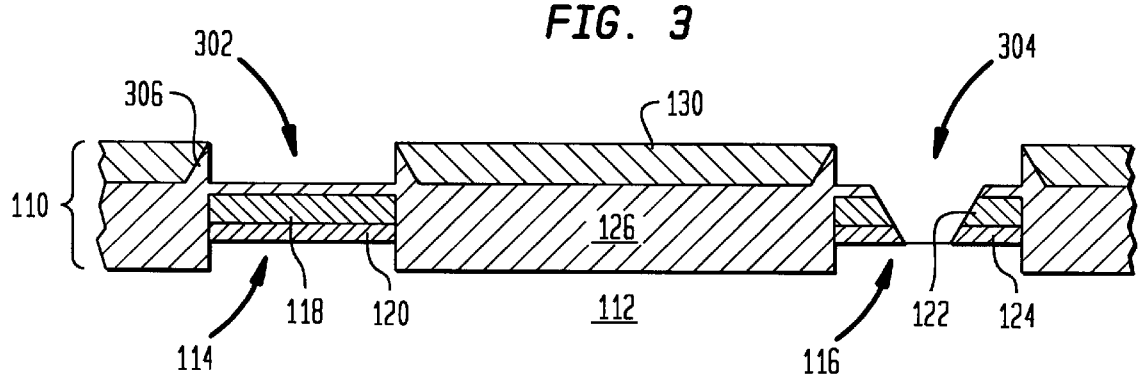
FIG. 3 shows the substrate of FIG. 2 after a dielectric etch has removed portions of the unprotected areas of silicon dioxide layer to form hollows.
Figure 4:
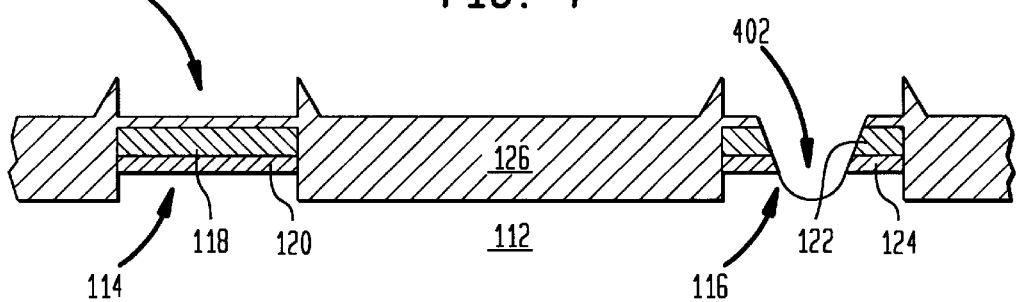
FIG. 4 illustrates the CMP-induced substrate defect, which is formed by a combination of CMP process defects and dielectric etching using the prior art etch process.
Figure 5:
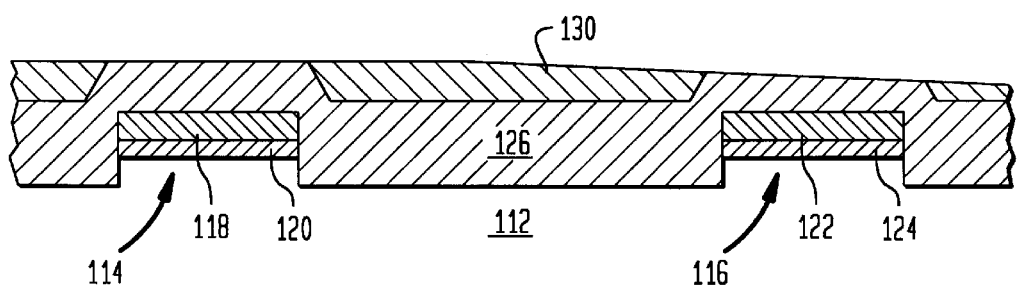
FIG. 5 illustrates a substrate, including mesa structures, which suffers from over-polishing during the CMP step.

In one embodiment, the inventive dielectric etching process employs an etchant source gas that includes $C_4F_8$ to etch through the TEOS oxide layer to form the aforementioned hollow (e.g., hollow 302 of FIG. 3). Optionally, argon and/or CO may be added to the dielectric etchant source gas. It is believed that argon improves the etch by providing bombardment while CO assists in improving etch uniformity.

In one embodiment, the inventive dielectric etch process is performed in an etch system known as Tel Unity II (TEL 850 Dual Dipole Ring Magnet) from Tokyo Electric of Tokyo, Japan. Other etch processes are also useful. Such etch processes include dry etching, plasma etching, reactive ion etching (RIE), electron cyclotron resonance (ECR) etching, high density plasma (HDP), or the like. As long as the dielectric etch process is substantially selective to both the polysilicon hard mask material and the underlying pad nitride material, any type of etch can be employed. This is because the invention lies, in part, in the nonobvious recognition that in a structure such as that disclosed herein, CMP-induced substrate defect can be effectively arrested by designing a dielectric (or oxide) etch process that does not etch through the pad nitride layer even if scratches or over-polishing occurs during CMP.

Using the aforementioned Tel Unity II etch system, the following etch parameters have been found to be suitable for an exemplary 8 inch wafer.

TABLE 1

|  | Suitable Range | Preferred Range | More Preferred Range |
| --- | --- | --- | --- |
| $C_4F_8$ Flow Rate (sccm) | 4–25 | 12–20 | 16 |
| Ar Flow Rate (sccm) | 0–750 | 100–500 | 380 |
| CO Flow Rate (sccm) | 0–750 | 100–500 | 300 |
| Power (W) | 300–3,000 | 700–2,000 | 1700 |
| Pressure (mTorr) | 2–200 | 2–60 | 40 |
| Magnetic Field (Gauss) | 0–120 | 0–120 | 120 |
| Time (seconds) | 54–66 | 57–63 | 60 |

The use of $C_4F_8$/Ar (and optionally CO) is nonobvious since this chemistry, in some cases, produces polymer deposition if used to etch through the dielectric layer. After etching, the polymer deposition needs to be removed in a separate process step. Accordingly, one skilled in the art without recognition of the need to also provide for pad nitride selectivity would not ordinarily use such a chemistry. Further, $C_4F_8$/Ar (and optionally CO) is typically a more expensive chemistry than other chemistries that may be used to etch the dielectric oxide layer while providing polysilicon selectivity (e.g., $CHF_3$/$CF_4$/Ar). Accordingly, the use of the inventive dielectric etch process is nonobvious without the recognition that pad nitride selectivity is advantageous in the reduction of CMP-induced substrate defects.

In one embodiment, the aforementioned polymer deposition from the use of $C_4F_8$/Ar (and optionally CO) in the dielectric etch process may be removed by an optional flash step (using, for example, $O_2$ as the flash source gas). In one case, a flash step of about 15 seconds has been found to work well in the aforementioned Tel Unity 2 chamber.

In another embodiment, a break through etch step may be employed to ensure that the underlying oxide is adequately exposed and/or to reduce the height of the oxide fence prior to performing the main dielectric etching step. With reference to FIG. 3, the oxide fence is depicted as fence 306. In one example, the break through etch has an oxide:polysilicon selectivity ratio which is approximately 1:1 to remove both polysilicon and oxide materials at approximately the same rate. Table 2 illustrates suitable parameters for such a break through etch step using an exemplary 8 inch wafer.

TABLE 2

|  | Suitable Range | Preferred Range | More Preferred Range |
| --- | --- | --- | --- |
| $CF_4$ Flow Rate (sccm) | 50–120 | 70–90 | 80 |
| $CHF_3$ Flow Rate (sccm) | 10–30 | 15–25 | 20 |
| Ar Flow Rate (sccm) | 0–200 | 10–50 | 16 |
| Power (W) | 200–2,000 | 300–1,000 | 400 |
| Pressure (mTorr) | 5–300 | 75–200 | 125 |
| Magnetic Field (Gauss) | 0–120 | 0–120 | 20 |
| Time (seconds) | 40–60 | 45–55 | 50 |

It has been found that the use of the inventive $C_4F_8$/Ar dielectric etch process advantageously yields significantly higher oxide:polysilicon selectivity than that achievable with the $CHF_3$/$CF_4$/Ar chemistry. In one case, the oxide:polysilicon selectivity is found to be about 25:1 or greater (compared to about 7:1 for the $CHF_3$/$CF_4$/Ar chemistry). Even if the selectivity is about 10:1 or higher (e.g., depending on the composition of the various layers and/or other etch conditions), this improvement also has value as it results in a more selective etch.

It has also been found that the use of the inventive $C_4F_8$/Ar dielectric etch process advantageously yields significantly higher oxide: nitride selectivity than that achievable with the $CHF_3$/$CF_4$/Ar chemistry. In one case, the oxide: nitride selectivity is found to be about 25:1 or greater (compared to about 2:1 for the $CHF_3$/$CF_4$/Ar chemistry). As mentioned earlier, this higher oxide: nitride selectivity prevents the pad nitride layer from being etched through during the dielectric etch step. Even if the selectivity is about 5:1, 10:1 or higher (e.g., depending on the composition of the various layers and/or other etch conditions), this improvement also has value as it results in a more selective etch. Accordingly, CMP-induced substrate defect is not an issue even if there are scratches and/or over-polishing during the CMP step.

Although the disclosure heretofore discusses $C_4F_8$ as one suitable oxide etchant that is selective not only to the polysilicon material of the hard mask but also to the nitride, other conventional etchants that have such functions are also useful. Merely by way of example, $C_2F_6$, $C_3F_8$, and $CH_3F$ etchants are useful. Additionally, etch chambers such as AME HDP tool from Applied Materials have been demonstrated with $C_2F_6$ and $C_3F_8$. The inventiveness herein lies, in part, in the nonobvious recognition that it is important to design an etch process that is not only selective to polysilicon but also to the underlying nitride to prevent CMP-induced substrate defects should scratches, over-polishing, and/or other CMP defects unduly reduce the thickness of the thin oxide layer above the nitride prior to the dielectric etch step. After the polysilicon layer is removed, additional processing steps may be performed to fabricate the finished IC. The resultant IC may be employed in a variety of electronic equipments, including computers, consumer electronic devices, commercial electronic devices, and the like.

While this invention has been described in terms of several preferred embodiments, there are alterations, permutations, and equivalents which fall within the scope of this invention. By way of example, although the invention has been described with reference to transistors to facilitate ease of understanding, it should be appreciated that the invention may be applicable to other types of devices, e.g., DRAMs.

Further, although a pad oxide layer is disposed under the pad nitride layer of the exemplary mesa structure, the invention works equally well with mesa structures that do not employ a pad oxide layer underneath. It should also be noted that there are many alternative ways of implementing the methods of the present invention. It is therefore intended that the following appended claims be interpreted as including all such alterations, permutations, and equivalents as fall within the true spirit and scope of the present invention.

What is claimed is:

1. A method for preventing CMP-induced (chemical-mechanical polish) damage to a substrate disposed below a pad nitride layer that is disposed above a mesa in the manufacture of shallow trench isolation field effect transistor (FET) devices; said pad nitride layer being disposed below a conformally deposited dielectric layer, said dielectric layer being disposed below a conformally deposited polysilicon layer, said method comprising:

planarizing said polysilicon layer down to at least a surface of said dielectric layer using said CMP to expose a first region of said dielectric layer;

etching partially through said first region of said dielectric layer using first etch parameters, said etching stops prior to reaching said nitride layer if said first region is undamaged by a CMP defect from said CMP, said first etch parameters include an etchant source gas that includes $C_4F_8$ and argon, said etching being sufficiently selective to said pad nitride layer to prevent said pad nitride layer from being etched through even in the presence of said CMP defect to said first region of said dielectric layer;

removing said polysilicon layer after said etching partially through said first region of said dielectric layer.

2. The method of claim 1 wherein said etchant source gas further includes CO.

3. The method of claim 2 wherein a flow rate of said CO is higher than a flow rate of said argon during said etching.

4. The method of claim 1 wherein said etchant source gas has an oxide:pad nitride selectivity of greater than about 25:1.

5. The method of claim 1 wherein said etchant source gas is also substantially selective to said polysilicon layer.

6. The method of claim 5 wherein said etchant source gas has an oxide:polysilicon selectivity of greater than about 25:1.

7. The method of claim 1 wherein said substrate is employed in the fabrication of a self-aligned field effect transistor (FET) device.

8. The method of claim 1 wherein said substrate is employed to fabricate a dynamic random access memory (DRAM) integrated circuit.

9. The method of claim 1 further comprising a break through etch step prior to said etching partially through said first region, said break through etch step employs a source gas that includes $CHF_3$ and $CF_4$.

10. The method of claim 1 wherein said removing said polysilicon layer is performed with a source gas that includes $SF_6$ and $NF_3$.

11. A method for manufacturing a shallow trench isolation (STI) field effect transistor (FET) device, said FET device being formed above a silicon mesa of a silicon substrate, comprising:

depositing a layer of pad nitride above said silicon mesa;

conformally depositing a layer of silicon dioxide above said pad nitride layer and an upper surface of said silicon substrate;

conformally depositing a layer of polysilicon above said silicon dioxide;

planarizing said polysilicon layer down to at least a surface of said silicon dioxide layer using a chemical-mechanical polish (CMP) process to expose a first region of said silicon dioxide layer, said first region being disposed above said pad nitride layer;

etching said first region of said silicon dioxide layer using first etch parameters, said etches only partially through said first region of said dielectric layer if said first region is undamaged by a CMP defect from said CMP, said first etch parameters being configured to leave a thin layer of said silicon dioxide above said pad nitride layer, said first etchant parameters include an etchant source gas that includes $C_4F_8$ and argon, said etching being sufficiently selective to said pad nitride layer to prevent said pad nitride layer from being etched through even in the presence of said CMP defect to said first region of said dielectric layer; and removing said polysilicon layer after said etching partially through said first region of said dielectric layer.

12. The method of claim 11 wherein said CMP defect includes a scratch in said first region of said silicon dioxide layer.

13. The method of claim 11 wherein said etchant source gas further includes CO.

14. The method of claim 13 wherein a flow rate of said CO is higher than a flow rate of said argon during said etching.

15. The method of claim 11 wherein said CMP defect includes over-polishing said first region of said silicon dioxide layer.

16. The method of claim 11 wherein said etchant source gas has an oxide:pad nitride selectivity of greater than about 25:1.

17. The method of claim 11 wherein said etchant source gas is also substantially selective to said polysilicon layer.

18. The method of claim 17 wherein said etchant source gas has an oxide:polysilicon selectivity of greater than about 25:1.

19. The method of claim 11 wherein said substrate is employed to fabricate a dynamic random access memory (DRAM) integrated circuit.

* * * * *